United States Patent
Wu

[11] Patent Number: 6,074,296
[45] Date of Patent: Jun. 13, 2000

[54] CASE FOR POWER SUPPLY

[75] Inventor: Chih-Chi Wu, Taoyuan Shien, Taiwan

[73] Assignee: Delta Electronics, Inc., Taiwan

[21] Appl. No.: 09/189,219

[22] Filed: Nov. 10, 1998

[30]  Foreign Application Priority Data

May 21, 1998 [TW] Taiwan ................................. 87207953

[51] Int. Cl.[7] .................................................. H05K 5/00
[52] U.S. Cl. .......................................... 454/184; 361/695
[58] Field of Search ........................... 454/184; 361/695, 361/697; 415/213.1, 213.4; 416/247 R

[56]  References Cited

U.S. PATENT DOCUMENTS

| | | | |
|---|---|---|---|
| 2,734,441 | 2/1956 | Williams | 454/184 |
| 2,825,500 | 3/1958 | Mclean | 454/184 |
| 4,751,872 | 6/1988 | Lawson, Jr. | 454/184 |
| 5,101,321 | 3/1992 | Remise et al. | 454/184 |
| 5,586,865 | 12/1996 | Yin | 361/695 |
| 5,713,790 | 2/1998 | Lin | 454/184 |
| 5,788,566 | 8/1998 | Mcanally | 454/184 |
| 5,890,959 | 4/1999 | Pettit et al. | 454/184 |
| 5,969,941 | 10/1999 | Cho | 454/184 |

*Primary Examiner*—Harold Joyce
*Assistant Examiner*—Derek S. Boles
*Attorney, Agent, or Firm*—Greer, Burns & Crain, Ltd.

[57]  ABSTRACT

A case for power supply having an air fan and a fan netting is developed. The case includes a case body having a fixing surface and a frame device disposed beyond the fixing surface such that the fan netting is fixed to the frame device from a first side of the fixing surface and the air fan is fixed to the frame device from a second opposite side of the fixing surface. The frame device further includes a frame disposed on the first side of the fixing surface and providing a space for accommodating therein the air fan and a fastener for putting the fan netting, the frame, and the air fan together upon the air fan being positioned in the space from the second side of the fixing surface so as to fix the fan netting and the air fan to the frame.

21 Claims, 6 Drawing Sheets

CASE FOR POWER SUPPLY

FIELD OF THE INVENTION

The present invention relates to a case, and more particular to a case including a case body and a frame device for fixing an air fan and a fan netting to an SFX (Small foam Factor project X) power supply so as to assemble the air fan and the fan netting effectively, save assembling time, increase productivity, reduce cost, and improve capability of competition.

BACKGROUND OF THE INVENTION

At present, as main frame becomes smaller and smaller, it is desirable to develop a power supply having small volume and high power. The air fan and the fan netting of a prior power supply are directly disposed inside the power supply resulting in an increased volume of the power supply which occupies too much space of a system. Furthermore, in order to reduce the volume of a power supply which can provide the same amount of power and generate the same amount of heat, a fan netting disposed beyond the case of a power supply is developed. However, the procedure for assembling an air fan and a fan netting to fabricate that kind of power supply is sophisticated, time-consuming, and costly.

Figure 1:
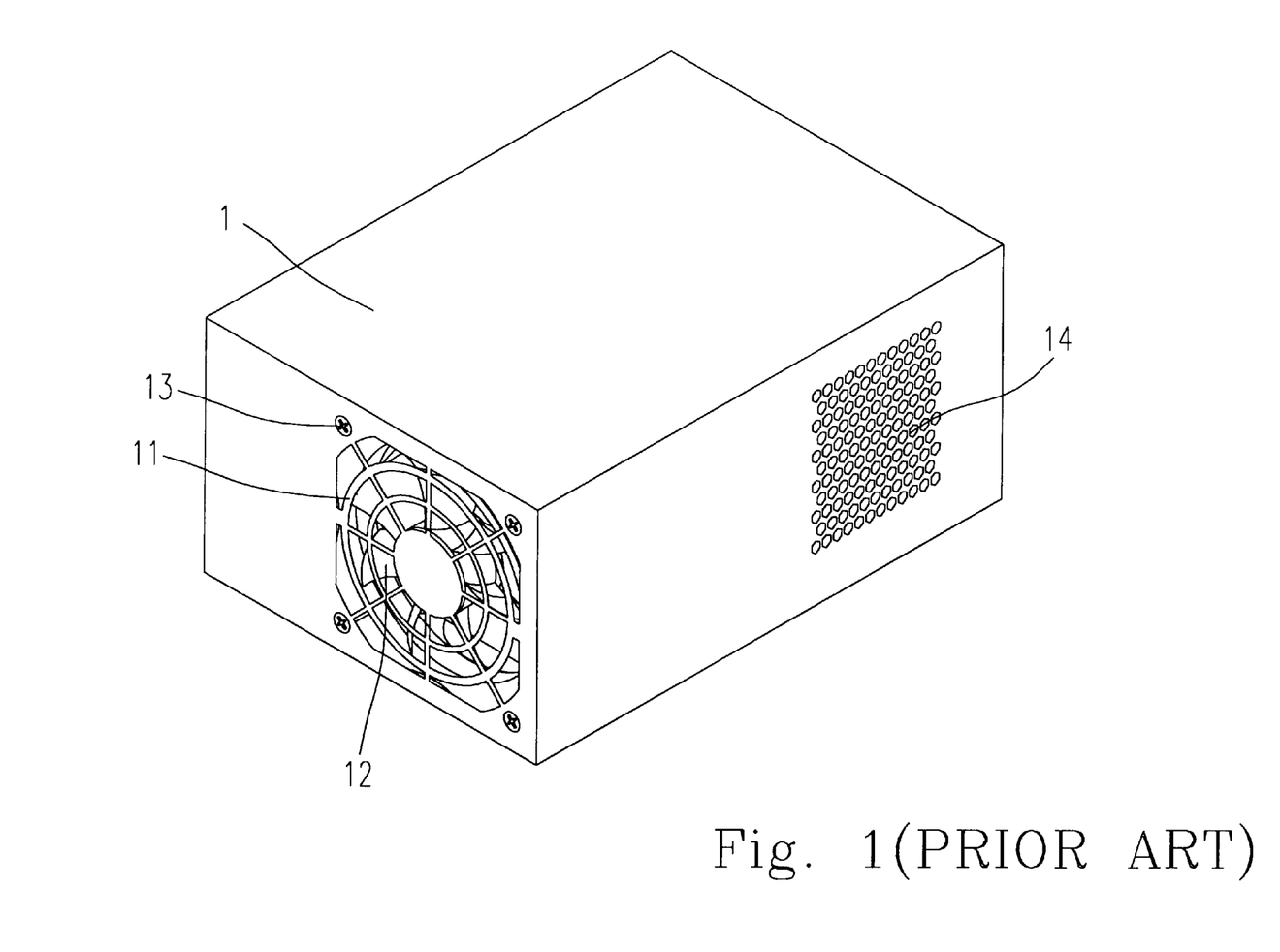
FIG. 1 is a schematic diagram showing the structure of a prior power supply.

Please refer to FIG. 1 which is a schematic diagram showing the structure of a prior power supply including a case 1, a fan netting 11, an air fan 12, a plurality of screws 13, and an air outlet 14. The air fan 12 is assembled directly inside the case 1 of the power supply. The fan netting 11 is formed by press and is integrally formed to the case 1.

Figure 2:
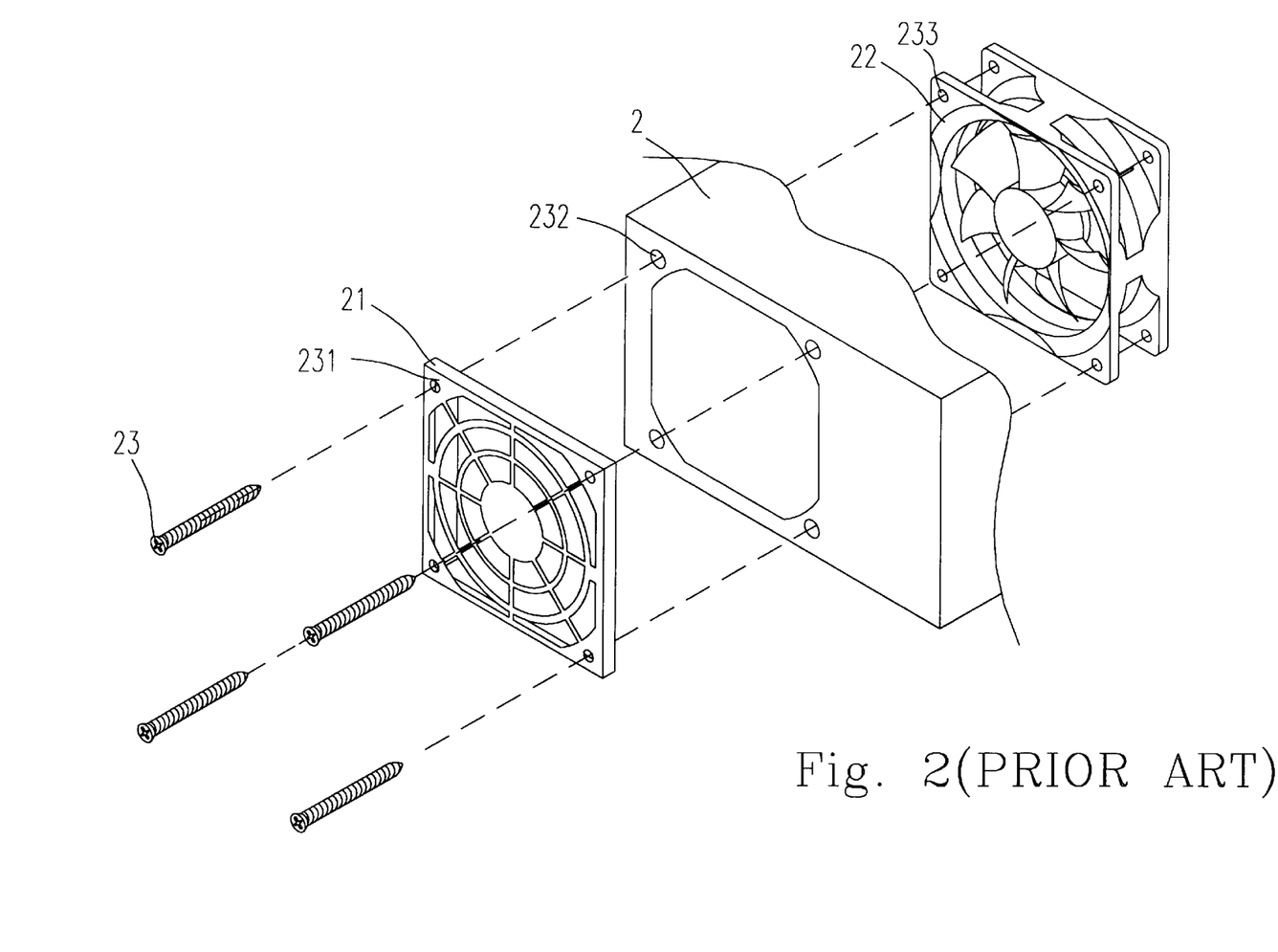
FIG. 2 is an exploded diagram showing the partial structure of another prior power supply.

Please refer to FIG. 2 which is an exploded diagram showing the partial structure of another prior power supply including a case 2 having a plurality of holes 232, a fan netting 21 having a plurality of threaded holes 231, an air fan 22 having a plurality of threaded holes 233, and a plurality of screws 23. The air fan 22 and the fan netting 21 are fixed to the case 2 by the screws 23 passing through the threaded holes 211, the holes 27, and the threaded holes 223 respectively and in sequence.

Figure 3:
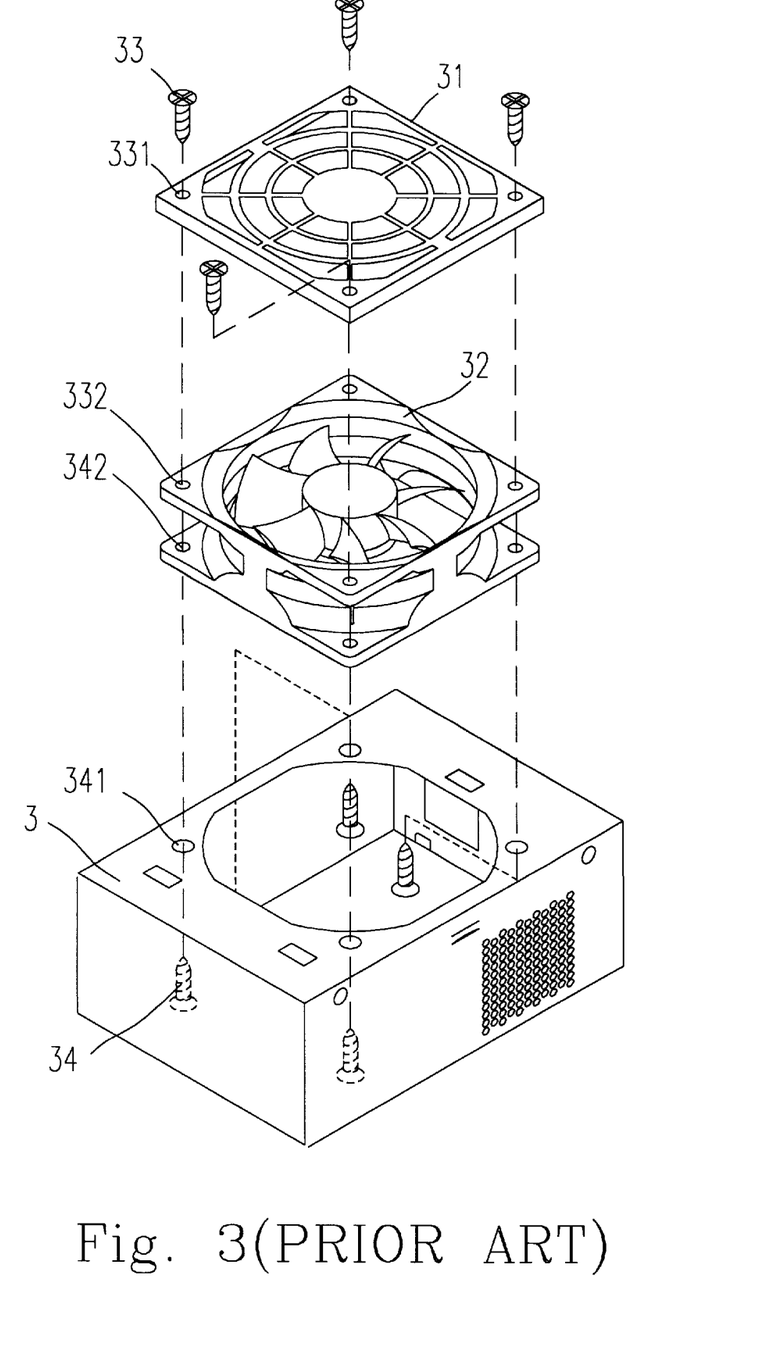
FIG. 3 is an exploded diagram showing the partial structure of the further another prior power supply.

Please further refer to FIG. 3 which is an exploded diagram showing the partial structure of another prior power supply including a case 3, a fan netting 31, a plurality of threaded holes 331, an air fan 32, a plurality of threaded holes 332, a plurality of threaded holes 342, a plurality of screws 33, a plurality of screws 34, and a plurality of holes 341. The air fan 32 is fixed to the case 3 by the screws 34 passing through the holes 341 on the case 3 and the threaded holes 342 on the air fan 32, respectively and in sequence. The fan netting 31 is fixed to the air fan 32 by the screws 33 passing through the threaded holes 331 on the fan netting 31 and the threaded holes 332 on the air fan 32, respectively and in sequence.

The commonly used manners of fixing an air fan and a fan netting in the industry are shown in FIGS. 1, 2, and 3. For the fixing manner shown in FIG. 1, the volume of a power supply must be considerably large so as to accommodate the air fan and exhaust the heat generated by the power supply. Consequently, this kind of power supply will occupy significantly large space. As for the fixing manner shown in FIG. 3, an air fan is disposed on the external side of a case so as to reduce the volume of a power supply. However, it needs to use screws to fix the air fan to the case and then use screws to fix the fan netting to the other side of the air fan. That assembling procedure is sophisticated, trivial, and time-consuming. Thus, it is tried by the applicant to deal with the situation encountered by the prior art.

SUMMARY OF THE INVENTION

An object of the present invention is to provide a case for a power supply to simplify the procedure of assembling an air fan and a fan netting to an SFX power supply.

According to one aspect of the present invention, the case includes a case body having a fixing surface and a frame device disposed beyond the fixing surface such that the fan netting is fixed to the frame device from a first side of the fixing surface and the air fan is fixed to the frame device from a second opposite side of the fixing surface.

In a preferred embodiment, the fan netting, the frame device, and the air fan are welded thereof together.

In accordance with another aspect of the present invention, the frame device further includes a frame disposed on the first side of the fixing surface and providing a space for accommodating therein the air fan, and a fastener for putting the fan netting, the frame, and the air fan together upon the air fan being positioned in the space from the second side of the fixing surface so as to fix the fan netting and the air fan to the frame.

In accordance with another aspect of the present invention, the air fan has a first hole and the fan netting has a second hole.

In accordance with another aspect of the present invention, the case body has an opening on said fixing surface.

In accordance with another aspect of the present invention, the frame further includes a frame body located around the opening and connected to the first side of the fixing surface, and a lug connected to the frame body and having a third hole.

In accordance with another aspect of the present invention, the first hole is a first threaded hole and the second hole is a second threaded hole.

In accordance with another aspect of the present invention, the third hole is a third threaded hole. The fastener is preferably a screw. The screw passes through the first threaded hole, the third threaded hole, and the second threaded hole in sequence so as to combine together the fan netting, the frame body, and the air fan.

In accordance with another aspect of the present invention, the fastener is a rivet. The rivet passes through the first hole, the third hole, and the second hole in sequence so as to rivet together the fan netting, the frame body, and the air fan.

In accordance with another aspect of the present invention, the fastener includes a bolt and a nut. The bolt passes through the first hole, the third hole, the second hole, and the nut in sequence so as to combine together the fan netting, the frame body, and the air fan.

In accordance with another aspect of the present invention, the air fan has a first snap head and a first socket.

In accordance with another aspect of the present invention, the case body has an opening on the fixing surface.

In accordance with another aspect of the present invention, the frame further includes a frame body located around the opening, connected to the first side of the fixing surface, and having a second socket for accommodating the first snap head of the air fan so as to position the air fan into the space; and a lug connected to the frame body and having a third socket on one side of the lug wherein the second socket forms a second snap head on an opposite side of the lug.

In accordance with another aspect of the present invention, the fastener is a third snap head attached to the fan netting. The third snap head snaps into the third socket on one side of the lug and forces the second snap head on the opposite side of the lug to snap into the first socket on the air fan so as to combine together the fan netting, the frame body, and the air fan.

In accordance with another aspect of the present invention, the power supply is a small foam factor project X (SFX) power supply.

The present invention may best be understood through the following description with reference to the accompanying drawings, in which:

DETAILED DESCRIPTION OF THE PREFERRED EMBODIMENTS

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

Figure 4:
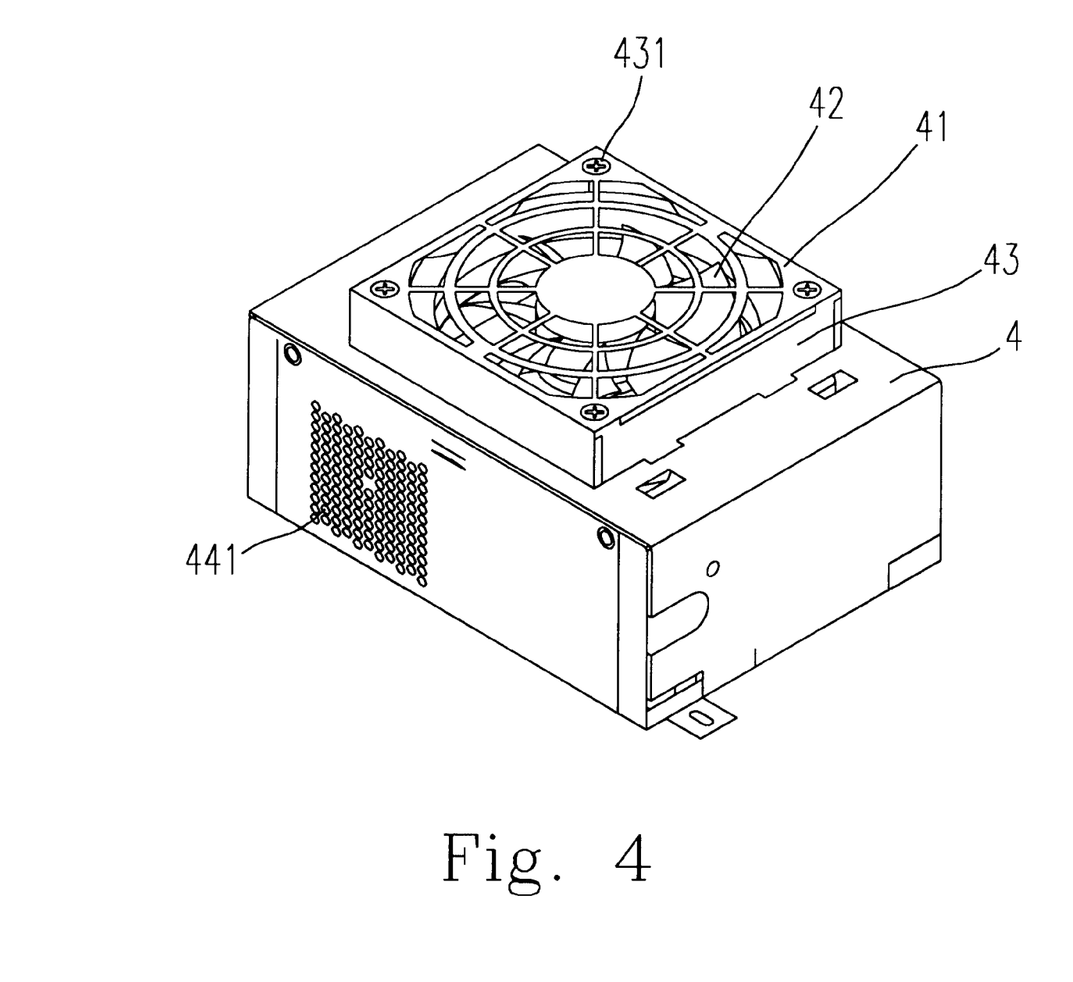
FIG. 4 is a schematic diagram showing a preferred embodiment of a power supply according to the present invention.

Please refer to FIG. 4 schematically showing a structure of a power supply according to the present invention. The power supply includes a case body 4, a fan netting 41, an air fan 42, a frame device 43, a plurality of screws 431, and an air outlet 441. The frame device 43 is integrally formed to the case body 4. The air fan 42 and the fan netting 41 are fixed to the frame device 43 by the screws 431. The power supply as shown in FIG. 4 is an SFX power supply. The heat generated from the system is dissipated by the air fan 42 and is exhausted out of the system through the air outlet 441.

Figure 5:
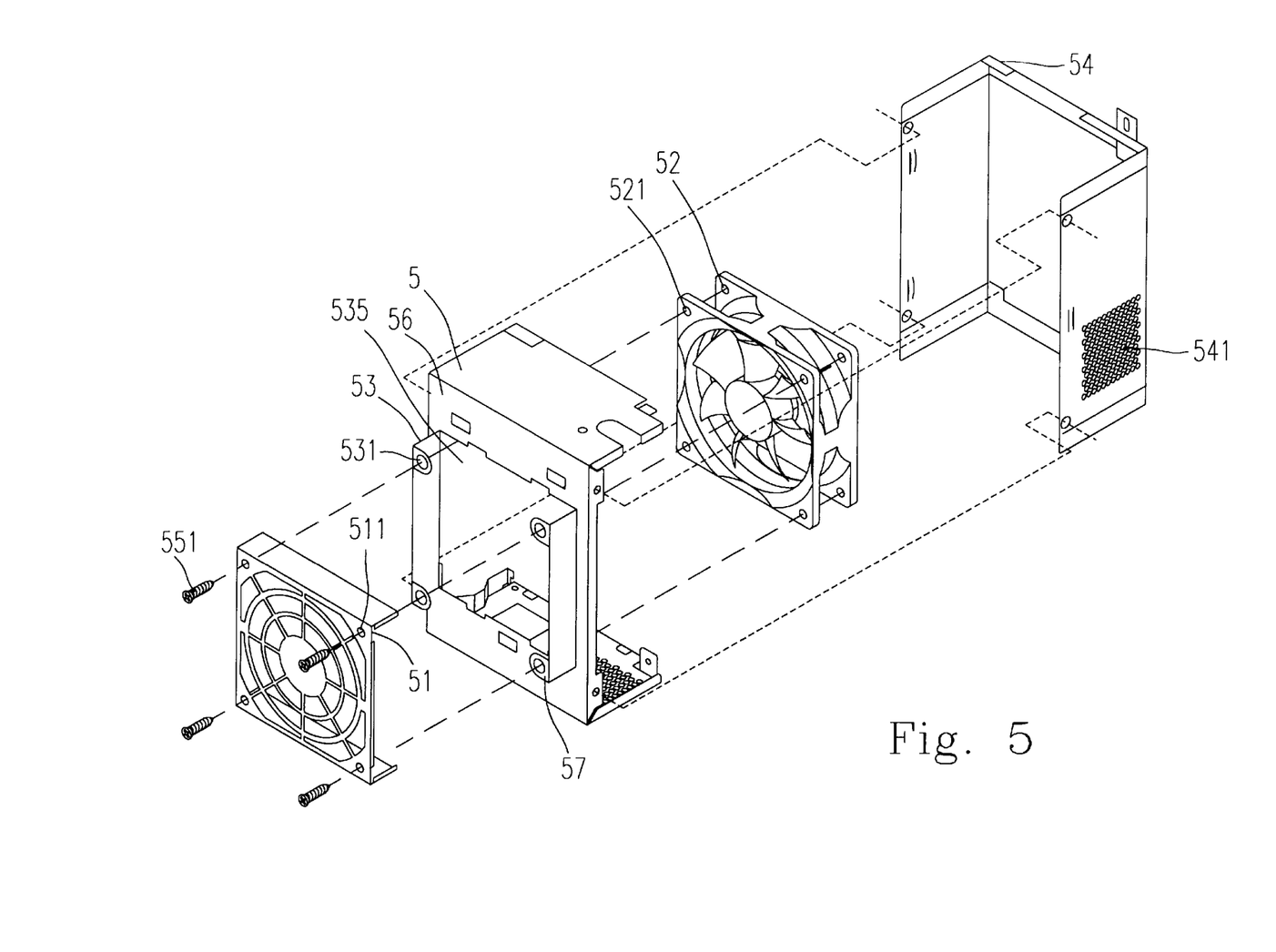
FIG. 5 is an exploded diagram showing the partial structure of a preferred embodiment of a power supply according to the present invention.

Please refer to FIG. 5 which is an exploded diagram showing the partial structure of a preferred embodiment of a power supply according to the present invention. This power supply includes a case body further including a lower cover 5 and a upper cover 54, a fan netting 51, an air fan 52, a frame device further including a frame 53 and a plurality of lugs 57, a plurality of screws 551, and a first side 56 and its opposite 59 of a fixing surface. It can be seen clearly from FIG. 5 that the frame 53 is connected to the first side 56 of the fixing surface of the lower cover 5. The fan netting 51 includes the second threaded holes 511. The air fan 52 has the first threaded holes 521. The lugs 57 include a third holes 531. As the air fan is placed in the space 535, the first threaded holes 521 are aligned to the third holes 531, respectively, and the fan netting 51 and the frame 53 are brought together to align the second threaded holes 511 to the third holes 531. The screws 551 then pass through the second threaded holes 511, the third holes 531 and the first threaded holes 521 respectively and in sequence so as to combine together the fan netting 51, the frame 53, and the air fan 52. The lower cover 5 is combined with the upper cover 54 as shown in FIG. 4. The lower cover 5 can also be integrally formed to the upper cover 54.

The fan netting, the air fan, and the frame can be riveted together by passing a plurality of rivets through the second holes on the fan netting, the third holes on the lugs, and the first holes on the air fan respectively and in sequence. The fan netting, the air fan and the frame can also be combined together by a plurality of bolts passing through the second holes on the fan netting, the third holes on the lugs, the first holes on the air fan, and a plurality of nuts respectively and in sequence. The fan netting, the air fan, and the frame can also be welded thereof together.

Figure 6:
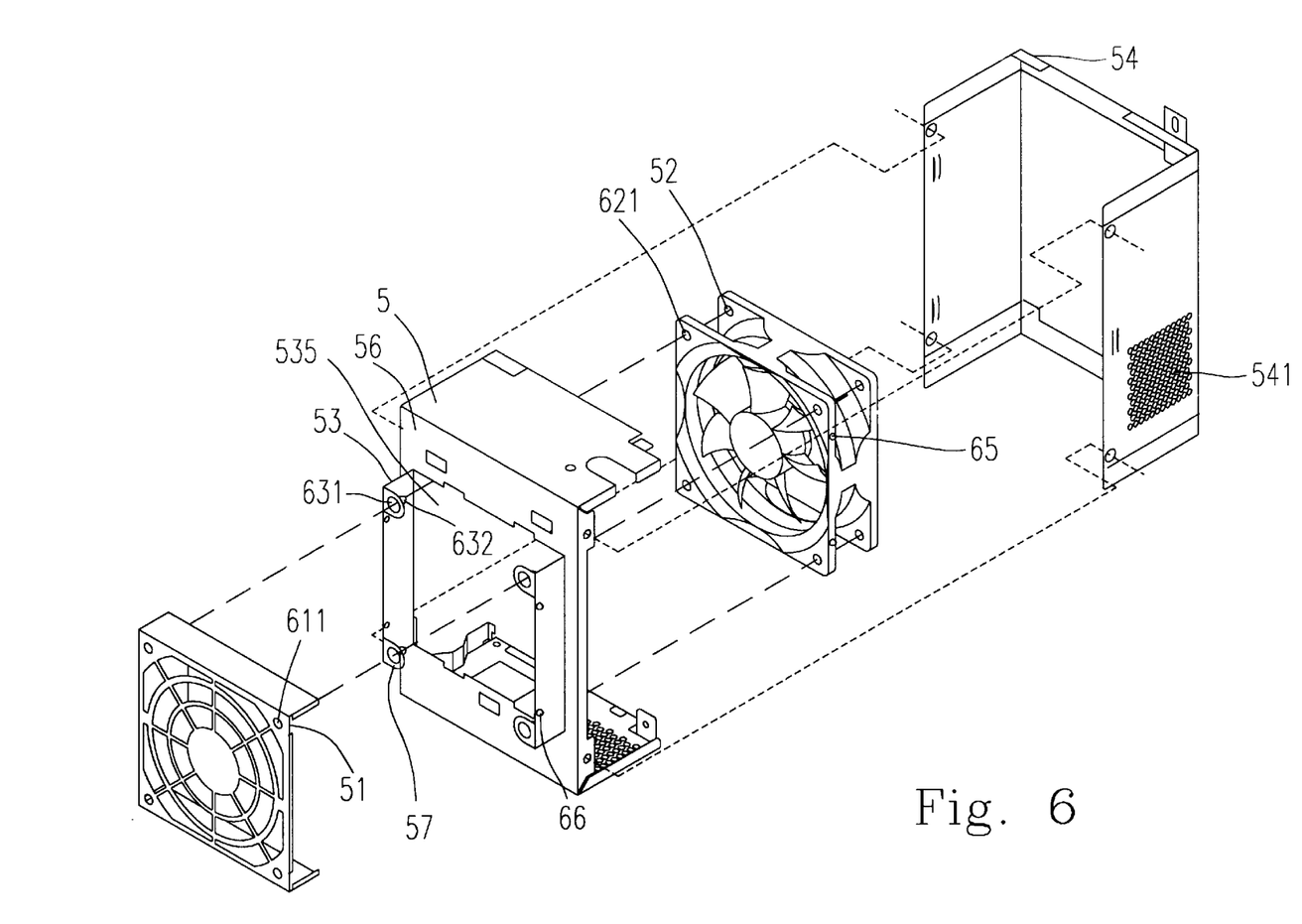
FIG. 6 is an exploded diagram showing the partial structure of a power supply having snap heads and sockets for fixing an air fan and a fan netting to a case body according to the present invention.

Please further refer to FIG. 6 which is an exploded diagram showing the partial structure of a preferred embodiment of a power supply according to the present invention. The power supply includes a case body having first snap heads 65 and first sockets 621 on an air fan 52, a frame 53, and third snap heads 611 attached to the fan netting 51. The frame 53 includes the second sockets 66 on the frame body for accommodating the first snap heads 65 of the air fan 52 so as to position the air fan 52 into a space 535, and a plurality of lugs 57 connected to the frame body and having third sockets 631 on one side of the lugs 57, respectively, wherein the third sockets 631 forms second snap heads 632 on an opposite side of the lugs 57, respectively. The third snap heads 611 snap into the third sockets 631 on one side of the lugs 57, respectively, and forces the second snap heads 632 on the opposite side of the lugs 57, respectively, to snap into the first sockets 621 on the air fan 52 so as to combine together the fan netting 51, the frame 53, and the air fan 52.

Thus, the case according to the present invention improves the sophisticated, trivial, and time-consuming procedure for assembling a prior SFX power supply in which it needs to use screws to fix an air fan to a case and then use screws to fix a fan netting to the other side of the air fan. The present invention provides a case for a power supply not only to simplify the assembling procedure but also to reduce the amount of screws needed for fixing an air fan and fan netting to a case.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A case for a power supply having an air fan and a fan netting, said case comprising:

a case body for receiving therein said power supply, said case body having a fixing surface with an opening generally conforming to the outer configuration of said air fan so that said air fan can extend through said opening;

a frame disposed beyond a first side of said fixing surface and forming a volumetric space for accommodating therein at least a substantial portion of the volume of said air fan, said frame having been integrally formed from material that was part of said fixing surface which was removed to form said frame and said opening in said case body; and, a fastener for attaching said fan netting, said frame and said air fan together, wherein said fan netting is fixed to said frame from said first side of said fixing surface and said air fan is fixed to said frame from a second side of a fixing surface opposite said first side.

2. The case according to claim 1 wherein said fan netting, said frame device, and said air fan are welded thereof together.

3. The case according to claim 2 wherein said air fan has a first hole.

4. The case according to claim 3 wherein said fan netting has a second hole.

5. The case according to claim 4 wherein said case body has an opening on said fixing surface.

6. The case according to claim 5 wherein said frame comprises:

a frame body located around said opening and connected to said first side of said fixing surface; and a lug connected to said frame body and having a third hole.

7. The case according to claim 6 wherein said first hole is a first threaded hole.

8. The case according to claim 7 wherein said second hole is a second threaded hole.

9. The case according to claim 8 wherein said third hole is a third threaded hole.

10. The case according to claim 9 wherein said fastener is a screw.

11. The case according to claim 10 wherein said screw passes through said second threaded hole, said third hole, and said first threaded hole in sequence so as to combine together said fan netting, said frame body, and said air fan.

12. The case according to claim 6 wherein said fastener is a rivet.

13. The case according to claim 12 wherein said rivet passes through said second hole, said third hole, and said first hole in sequence so as to rivet together said fan netting, said frame body, and said air fan.

14. The case according to claim 6 wherein said fastener includes a bolt and a nut.

15. The case according to claim 14 wherein said bolt passes through said second hole, said third hole, said first hole, and said nut in sequence so as to combine together said fan netting, said frame body and said air fan.

16. The case according to claim 1 wherein said air fan has a first snap head and a first socket.

17. The case according to claim 16 wherein said case body has an opening on said fixing surface.

18. The case according to claim 17 wherein said frame comprises:

a frame body located around said opening, connected to said first side of said fixing surface, and having a second socket for accommodating said first snap head of said air fan so as to position said air fan into said space; and a lug connected to said frame body and having a third socket on one side of said lug wherein said second socket forms a second snap head on an opposite side of said lug.

19. The case according to claim 18 wherein said fastener is a third snap head attached to said fan netting.

20. The case according to claim 19 wherein said third snap head snaps into said third socket on one side of said lug and forces said second snap head on the opposite side of said lug to snap into said first socket on said air fan so as to combine together said fan netting, said frame body, and said air fan.

21. The case according to claim 1 wherein said power supply is an small foam factor project X (SFX) power supply.

* * * * *

UNITED STATES PATENT AND TRADEMARK OFFICE
CERTIFICATE OF CORRECTION

PATENT NO. : 6,074,296  Page 1 of 2
DATED : June 13, 2000
INVENTOR(S) : Chin-Chi Wu It is certified that error appears in the above-indentified patent and that said Letters Patent is hereby corrected as shown below:

In the Drawing:

Sheet 5, substitute the following FIG. 5:

Fig. 5

UNITED STATES PATENT AND TRADEMARK OFFICE
CERTIFICATE OF CORRECTION

PATENT NO. : 6,074,296
DATED : June 13, 2000
INVENTOR(S) : Chin-Chi Wu

It is certified that error appears in the above-indentified patent and that said Letters Patent is hereby corrected as shown below:

Column 4, line 65, after "frame" insert --with a plurality of attachment lugs--.

Column 5, line 1, after "frame" insert --and lugs--.

Signed and Sealed this

Seventeenth Day of April, 2001

*Attest:*

NICHOLAS P. GODICI

*Attesting Officer*   Acting Director of the United States Patent and Trademark Office